United States Patent
Cox (10) Patent No.: US 6,580,289 B2
(45) Date of Patent: Jun. 17, 2003

(54) CELL ARCHITECTURE TO REDUCE CUSTOMIZATION IN A SEMICONDUCTOR DEVICE

(75) Inventor: William D. Cox, Chapel Hill, NC (US)

(73) Assignee: Viasic, Inc., Chapel Hill, NC (US)

( * ) Notice: Subject to any disclaimer, the term of this patent is extended or adjusted under 35 U.S.C. 154(b) by 0 days.

(21) Appl. No.: 10/164,455

(22) Filed: Jun. 6, 2002

(65) Prior Publication Data

US 2002/0186045 A1 Dec. 12, 2002

Related U.S. Application Data

(60) Provisional application No. 60/296,854, filed on Jun. 8, 2001.

(51) Int. Cl.⁷ .................................. H03K 19/177
(52) U.S. Cl. ........................ 326/40; 326/39; 326/41
(58) Field of Search ........................ 326/37–41

(56) References Cited

U.S. PATENT DOCUMENTS

| 5,068,603 | A | | 11/1991 | Mahoney |
| 5,815,726 | A | * | 9/1998 | Cliff ............................ 712/1 |
| 5,898,318 | A | * | 4/1999 | Pedersen ...................... 326/39 |
| 5,905,385 | A | * | 5/1999 | Sharpe-Geisler ............. 326/39 |
| 5,999,015 | A | * | 12/1999 | Cliff et al. .................... 326/39 |
| 6,014,038 | A | | 1/2000 | How et al. |
| 6,194,912 | B1 | | 2/2001 | Or-Bach |
| 6,236,229 | B1 | | 5/2001 | Or-Bach |
| 6,245,634 | B1 | | 6/2001 | Or-Bach |
| 6,294,927 | B1 | | 9/2001 | Yoeli et al. |
| 6,331,733 | B1 | | 12/2001 | Or-Bach et al. |
| 6,331,789 | B2 | | 12/2001 | Or-Bach |
| 6,331,790 | B1 | | 12/2001 | Or-Bach et al. |

* cited by examiner

*Primary Examiner*—Michael Tokar
*Assistant Examiner*—Vibol Tan
(74) *Attorney, Agent, or Firm*—Moore & Van Allen PLLC; Charles L. Evans (57) ABSTRACT

A semiconductor device and method of testing the device having a plurality of logic cells interconnected using vias to connect routing tracks that are disposed among a plurality of layers in the device. The logic cells in the device including at least two three-input look-up tables, one two-input look-up table and a flip-flop. The components in the logic cell are connected so that any look-up table can drive at least one input of any other look-up table and where the flip-flop is connected to the look-up tables so that any look-up table can drive an input of the flip-flop.

14 Claims, 9 Drawing Sheets

CELL ARCHITECTURE TO REDUCE CUSTOMIZATION IN A SEMICONDUCTOR DEVICE

CROSS-REFERENCE TO RELATED APPLICATIONS

This application claims priority from co-pending provisional patent application serial No. 60/296,854, filed Jun. 8, 2001, by the inventor hereof, the entire disclosure of which is incorporated herein by reference.

BACKGROUND

For many years, gate arrays have been used to provide quick-turnaround, low non-recurring-expense (NRE) semiconductor devices that are used for a variety of purposes. Traditionally, semiconductor wafers are processed up to but not including the first (bottom) metal layer, and then the wafers are saved in inventory. When a customer orders a semiconductor device to be fabricated for a specific application (an application specific integrated circuit or "ASIC"), the customer only has to pay for the masks that are required to configure the metal layers, but not for the transistor layers below. Thus, NRE is reduced. The wafers may be completed quickly, since only the metal layers remain to be fabricated, which also reduces the turn-around time that is necessary to build the device.

Recently more and more layers of metal have been incorporated into gate array semiconductor devices. Rather than two or three layers of metal, six to eight layers of metal are now common. As a result, gate arrays are no longer very low NRE, or provide quick-turnaround times. In order to regain the advantages of earlier gate arrays, several vendors have developed logic arrays, consisting of multiple, substantially identical logic cells, that may be configured for an application with either fewer or cheaper masks. In the case of fewer masks, the total number of metal layers and hence masks used to create the finished device often does not change. Rather, only a reduced subset of the total number of metal layers in a finished device are used to impart the custom configuration to the device. For example, so-called "one-mask" devices, in which only a single metal layer and hence a single mask imparts customization, may reduce both NRE and the turnaround-time.

An ASIC is a semiconductor device that combines large numbers of programmable blocks of logic circuits into a logic cell to create a device that is specifically adapted for a particular application, but at a cost that is lower than that of developing a completely new device from scratch. Like most integrated circuit chips, ASIC chips are manufactured using a lithographic process that depends on having a mask for each layer of the chip. In the case of a completely new chip, many unique masks may be required. In the case of an ASIC such as a gate array, however, some masks are generic, that is, the same for each different type of ASIC of a given programmable architecture, regardless of the application, while some are custom. It is the custom masks that impart the application specificity to the chip by programming the logic cells during the manufacturing process. Multiple custom masks may be required to accomplish the programming of an ASIC. The number depends to some extent on the design of the programmable cells. Although the number of custom masks required is less than the total number of masks, and certainly less than the number of masks required to create a completely new chip from scratch, each custom mask represents a significant cost in both money and development time.

In many cases, the cell architecture of an ASIC may be designed to reduce the number of custom masks that may be required to just one mask, which provides a significant cost and time savings. A "one mask" device allows all of the masks to remain generic except for a single mask, thus allowing the semiconductor manufacturer to invest in the generic or base masks just one time. Various designs may be implemented by customizing just a single mask instead of a complete mask set.

SUMMARY

The present invention provides for a semiconductor device and a method of testing the device having a plurality of logic cells interconnected using vias to connect routing tracks that are disposed among a plurality of layers in the device. The logic cells in the device include at least two three-input look-up tables, one two-input look-up table and a flip-flop. The components in the logic cell are connected so that any look-up table can drive at least one in-put of any other look-up table and where the flip-flop is connected to the lookup tables so that any look-up table can drive an input of the flip-flop.

In some embodiments, the semiconductor device may be designed to be configured or customized using less than the actual number of metal (including via) layer masks that will actually be used to create a final device. In some cases, this configuration will be accomplished with a single metal layer mask, which may be either a mask designed to create a layer of actual metal traces, or a layer of vias which move signals between metal layers.

In any case, a completed device is made by first forming the semiconductor layer where cells contain mask-configurable gate array as described above. Then, the plurality of metal layers are formed on top of the semiconductor layer for routing connections. At least some of the plurality of metal layers are customized and may be used to configure the device for a specific application.

DESCRIPTION OF THE INVENTION

It is to be understood that the present invention is not limited to the example embodiments disclosed herein. The meaning of certain terms as used in the context of this disclosure should be understood as follows. The term "configuration" and variants such as "configurable" and "configured" refer to the property or process of imparting application-specific function to an integrated circuit chip. The term "metal layer" refers to any layers that are used to make connections to implement the functions of the cells of a device. These metal layers may be the same for every version of a semiconductor device, or they may be used for configuration. In addition, metal layers may contain actual metal routing traces or vias, which provide vertical connectivity between metal routing layers. Finally, the term "chip" and variations such as "integrated circuit chip" or "semiconductor chip" are normally meant to refer to an intermediate device that has not been configured, and may be in the form of a wafer. A finished device such as an application-specific integrated circuit (ASIC) will be referred to as a "device" or with a variant term such as "semiconductor device" or the like. Other terms will either be discussed when introduced, or otherwise should be assumed to have the conventional meaning as understood by persons of ordinary skill in the art.

The present invention in some embodiments defines a cell architecture for an ASIC that reduces the number of custom masks required to just one mask, representing significant cost and time savings. In some embodiments, the invention allows all of the masks to remain generic except for the via mask, which determines where the so-called "vias" will be placed to make connections between layers. By using the architecture of the invention, the semiconductor manufacturer may invest in the generic or base masks just one time. Various designs are then implemented by customizing just the via mask instead of a complete mask set.

Figure 1:
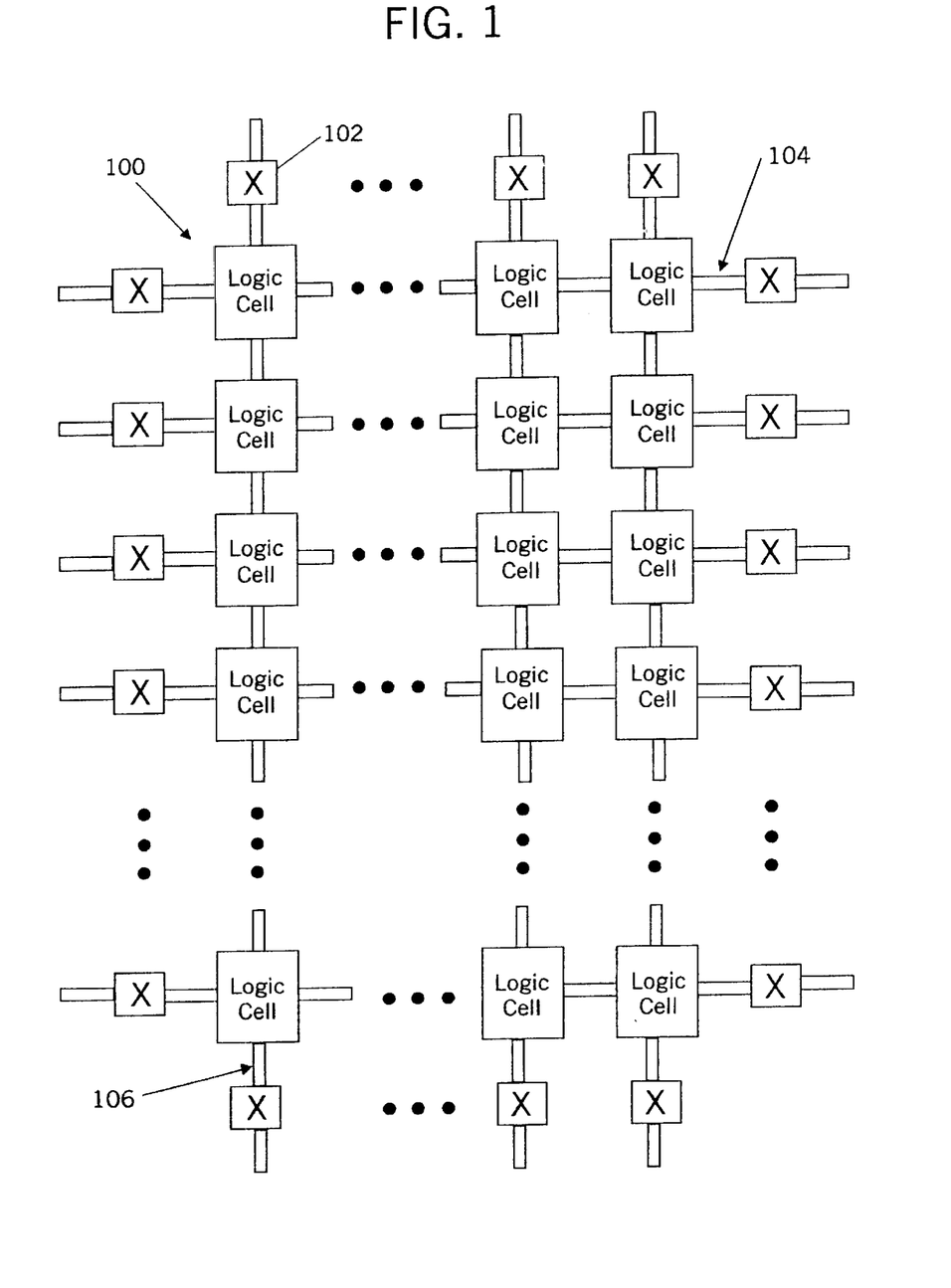
FIG. 1 illustrates an 8 by 8 array of logic cells according to at least some embodiments of the present invention.

A device according to the present invention has rows and columns of logic cells, where each cell may implement about 10 ASIC gates worth of logic. FIG. 1 illustrates an 8 by 8 array of logic cells 100 that would have 32 pads 102 around the edge of the die. Horizontal routing tracks 104 and vertical routing tracks 106 connect the logic cells 100 together. These tracks are formed of segmented wires of fixed length that may be connected end-to-end through vias, which are shown in more detail in FIG. 2. The inputs and outputs of the logic cells 100 communicate using routing tracks 104 and 106 through the vias.

Figure 2:
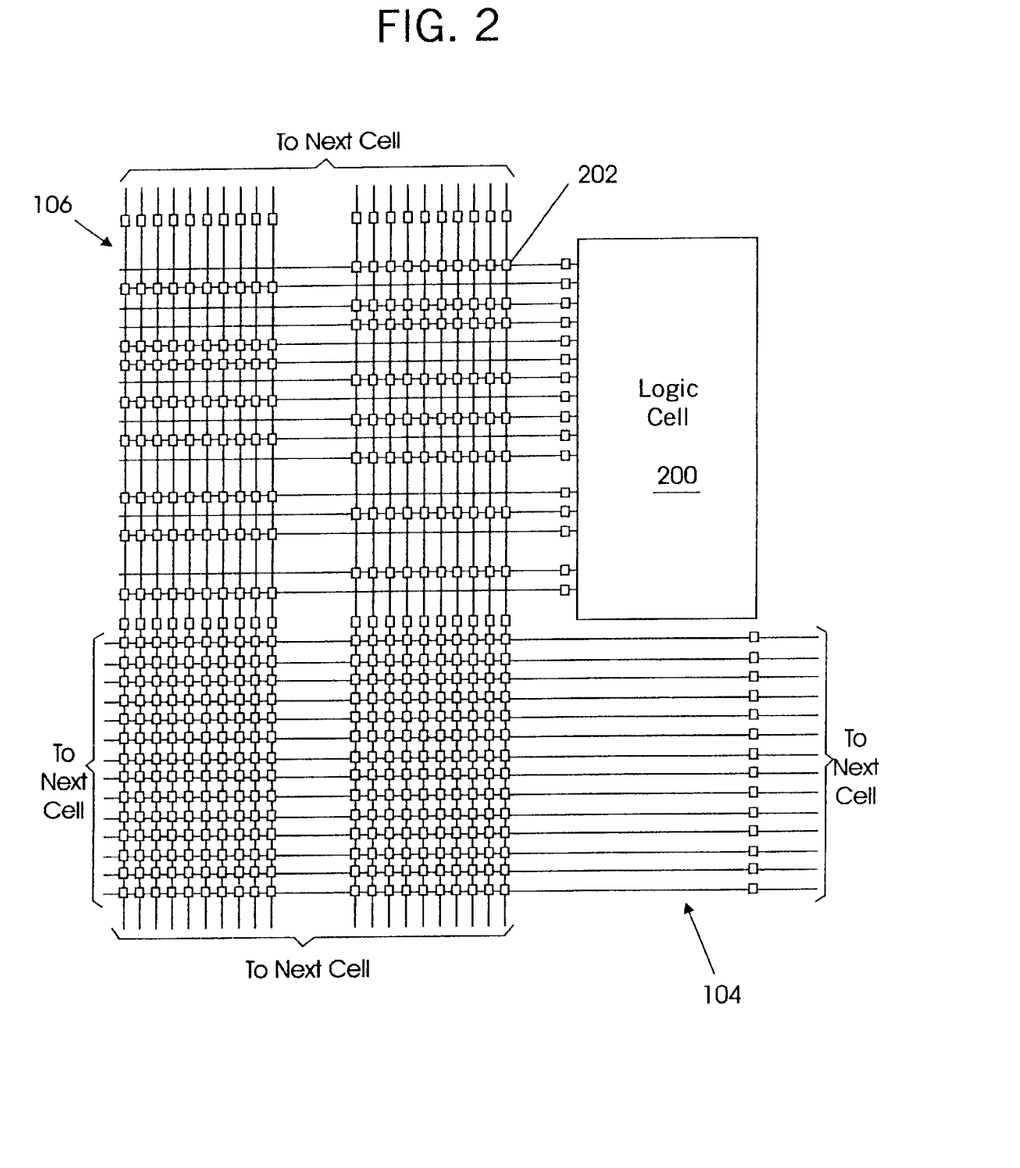
FIG. 2 illustrates a single logic cell and surrounding routing tracks according to the present invention.

FIG. 2 illustrates a single logic cell 200 and how the cell connects to surrounding cells. The logic cell 200 is connected to the other logic cells in the array using the horizontal and vertical routing tracks 104 and 106 that consist of 20 vertical and 14 horizontal segmented lines. When vertical and horizontal wires in the routing tracks cross each other, vias 202 are used to connect them.

Figure 3:
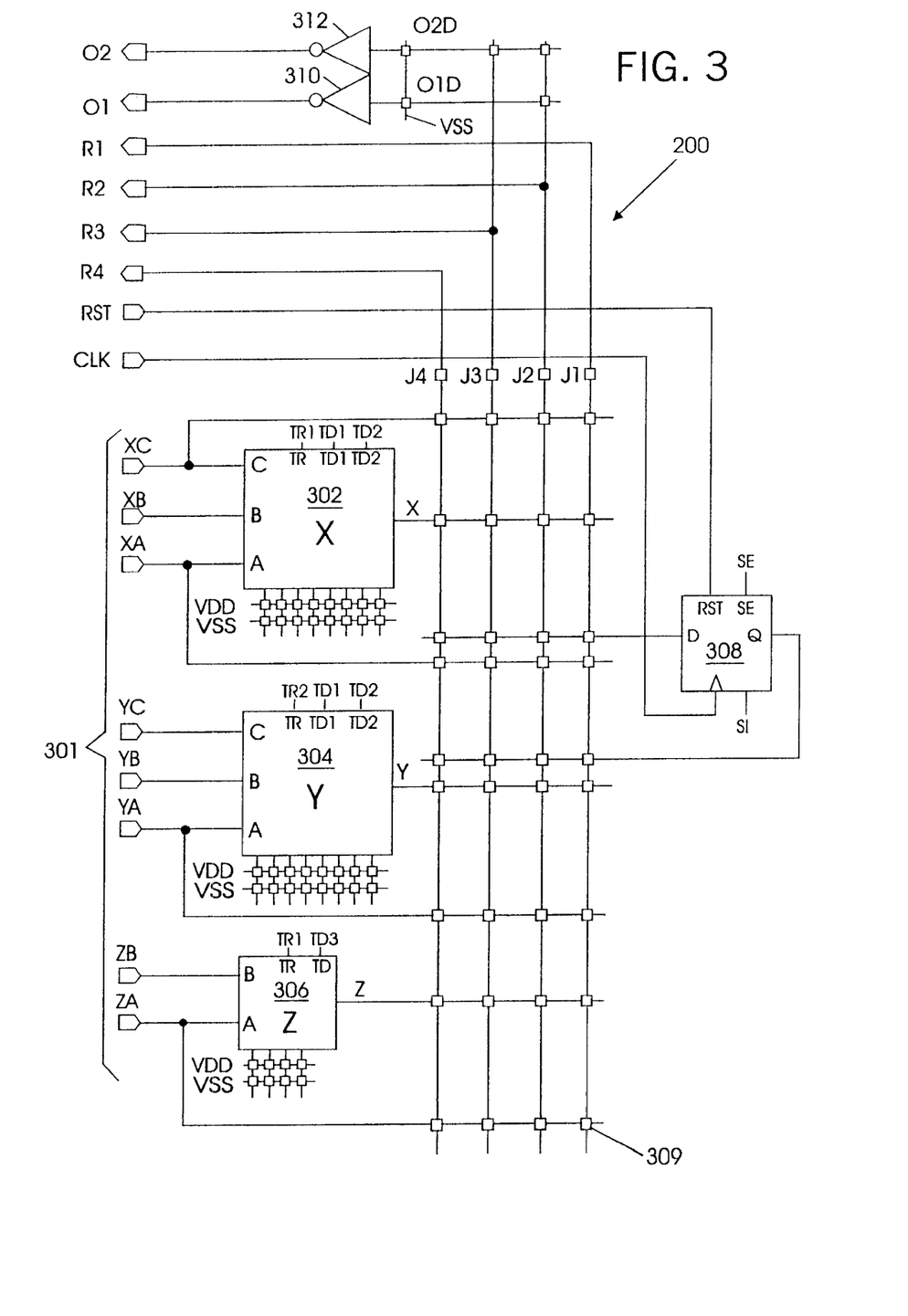
FIG. 3 is a detailed logic diagram of a single cell architecture that may be used with the invention.

FIG. 3 is an embodiment of the present invention showing a more detailed logic diagram of one of the cells of FIGS. 1 and 2. Logic cell 200 includes three look-up tables (LUT's), 302, 304 and 306, a flip-flop, 308, and two buffers or inverters, 310 and 312. LUT's X, 302, and Y, 304, each have three logic inputs A, B and C. LUT Z, 306, has two logic inputs A and B. The LUT inputs are shown at 301. The VDD and VSS signals are hard-wired into the logic cell 200 and are not shown. There is routing internal to the cell that allows any LUT to drive at least one input of any other LUT. The cell includes two inverters, 310 and 312, that may also be buffers. The inverters or buffers serve to increase the drive strength of the output signals O1 and O2.

Logic cell 200 also includes flip-flop 308 that has an output Q and an input D that can be driven by any LUT. The CLK, RST, SE and SI signals are traditional scanned-flop clock, reset, scan-enable and scan-input that allow flip-flop 308 to be connected in a traditional scan chain for scan testing. The SE and SI signals are hard-wired into the cell. The exact clock scheme depends on the implementation, however there is a clock and reset signal generator every 8 rows of logic cells. These clock cells drive the reset and clock signals for the 8 logic cells directly below them. This allows flip-flop 308 within the cell 200 to be simplified, and enables testing by disabling all reset lines, and gating the test clock onto all flop clocks.

The configuration of the cell may be controlled in part by programming the via connections illustrated as 309. Jumpers J1, J2, J3 and J4 may provide for an increase in density by allowing some configuration of this portion of the cell outside of using the general purpose routing tracks. Signals R1, R2, R3 and R4 are wires that connect to the general purpose routing tracks that allow unbuffered signals to be routed short distances.

Figure 4:
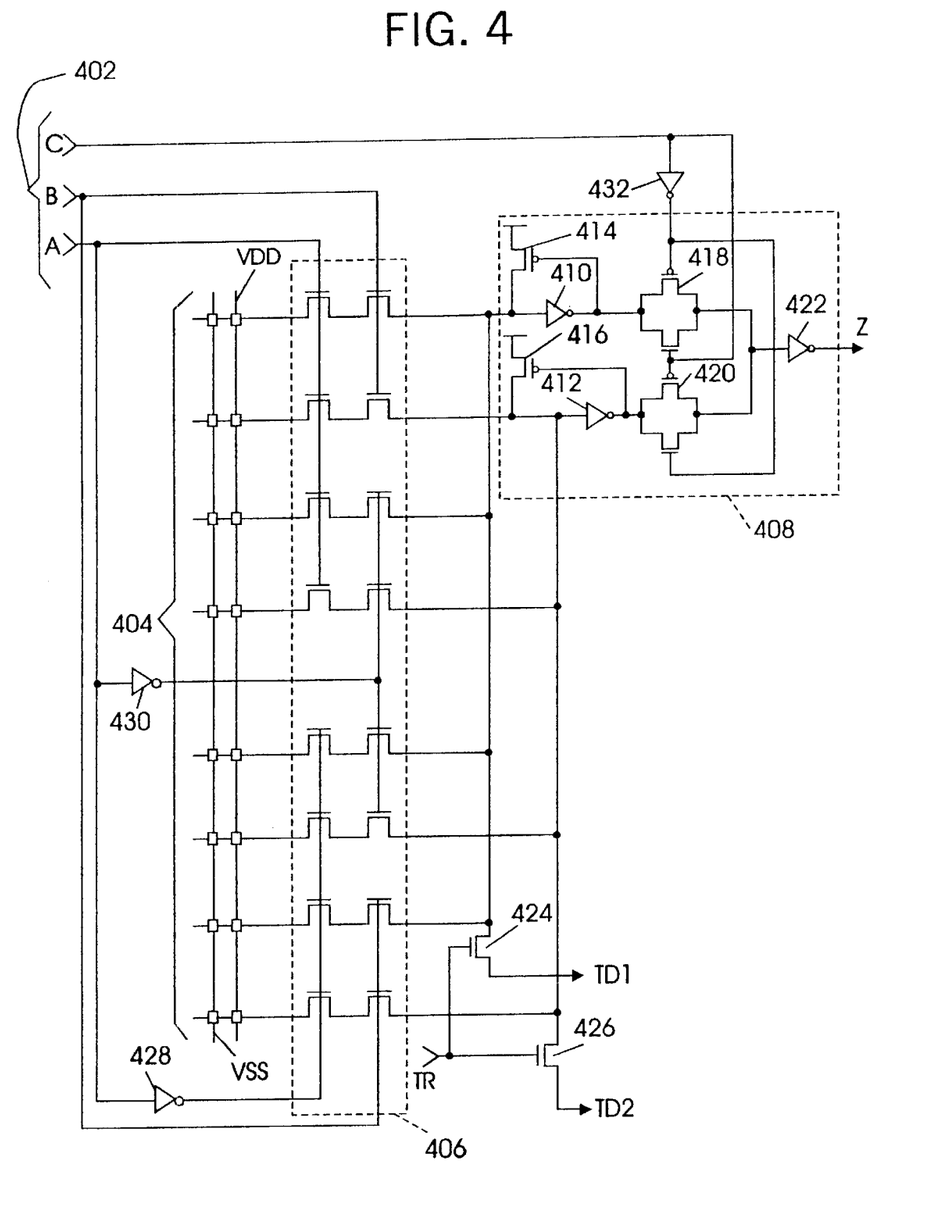
FIG. 4 illustrates an exemplary 3-input lookup table with a test circuit according to at least some embodiments of the present invention.
Figure 5:
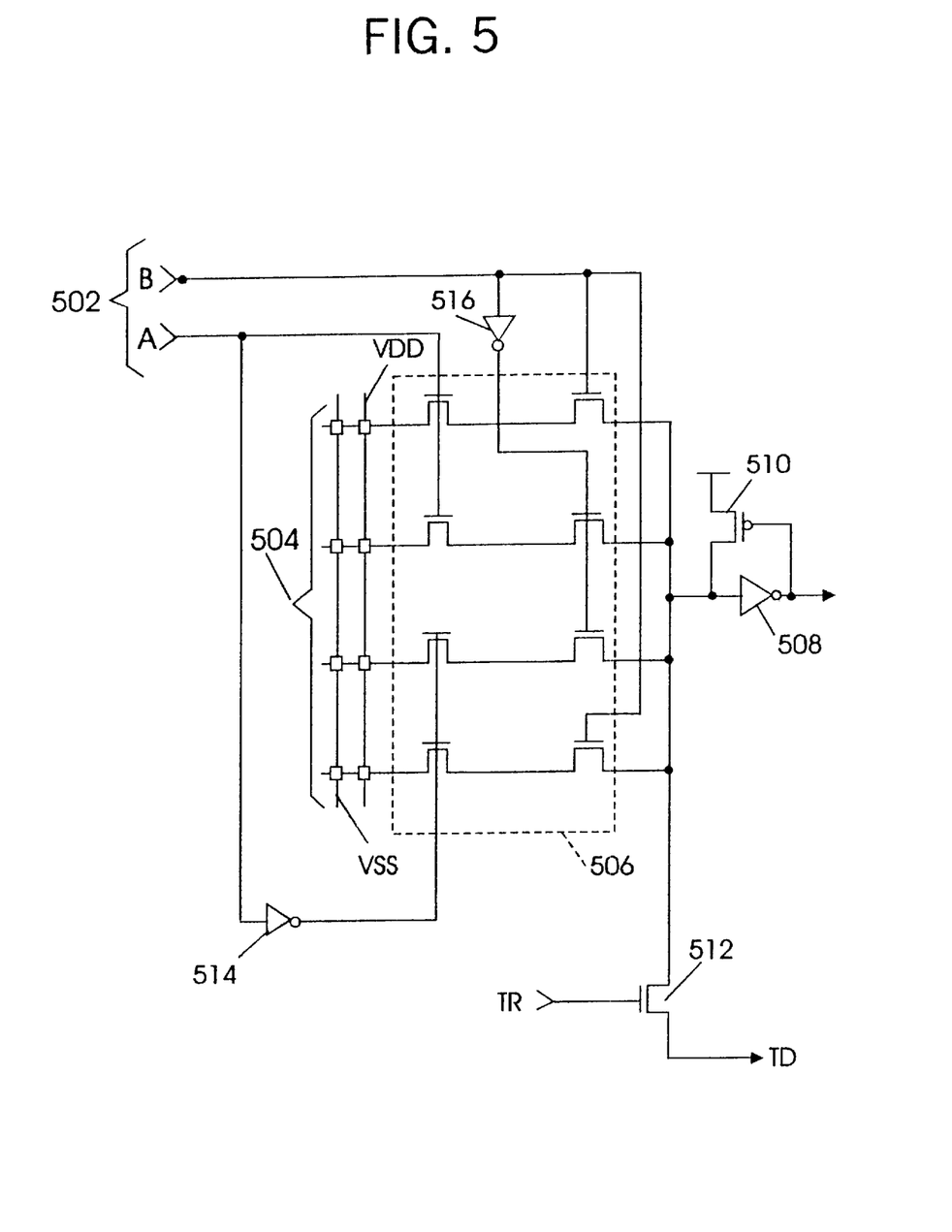
FIG. 5 illustrates an exemplary 2-input lookup table with a test circuit according to at least some embodiments of the present invention.

In a practical semiconductor device, each LUT may be provided with appropriate test data lines to send data from a selected column of the LUT to the edge of the chip die for testing. Of course, in such a case lines are also provided to determine which column's data is to be communicated to the edge of the chip. FIGS. 3–5 illustrate an embodiment of a method and apparatus for testing a semiconductor device using the test read lines (TR) and test data lines (TD, TD1 and TD2). The signals TD1–TD3 in combination with TR1 and TR2 allow for up to 6 internal test points (3×2) of which 5 are used in one embodiment of the present invention. The test signals are hard-wired into the logic cell and are not routed using the general purpose routing tracks. In one embodiment of the present invention, read circuits are located at the end of each row of logic cells to read the data from the internal nodes of the LUT's by utilizing the test data lines. The internal nodes of the LUT's are read using a read circuit in such a manner that a significant charge is required in order to flip the state of the read line in the circuit which indicates that the internal nodes probed in the LUT are not floating. Previous test circuits would only check the output of the LUT's, which could be driven high or low with good strength even if the internal nodes were floating.

In one embodiment, a method of testing the device includes the use of test vectors that are generated in the traditional means (with an ATPG program). The test vectors are applied using a built-in scan-chain. While the results of a vector are valid, the internal LUT nodes are read onto the TD lines, one column at a time. A single column is enabled with a single TR line and then the TD lines send the values internal to the LUT's to the edge of the device where they can be processed. The read circuits at the edge of the die may determine if the TD lines are being actively driven to a state, or if they are floating.

A LUT, as shown in FIG. 3, is built from one or more multiplexers with constant data inputs. The logic inputs into the cell drive the select lines of the multiplexers. A LUT of N inputs may be implemented with a multiplexer of $2^N$ data inputs programmably tied to one of the supply voltages through vias. FIG. 4 illustrates a 3-input LUT (similar to LUT's X and Y shown in FIG. 3) with a test circuit implemented in an 8-to-1 multiplexer as well as the method of using the test circuit. The logic inputs 402 drive the select lines of the multiplexer using the inverters 428, 430 and 432 that enable only one selected path through the multiplexer at a time. The data inputs 404 have constant inputs that are programmably tied to one of the supply voltages through vias. The LUT has two columns of n-channel mosfets 406 that are basically two 4-to-1 multiplexers. Notice that there are 8 pairs of n-channel mosfets in series. This could be implemented as 8 feeding 4; however, a better utilization of the layout area will occur with this implementation. The upper four pair of mosfets are enabled with the four possible combinations of A and not-A, and B and not-B. Depending on the state of the A and B select lines, one of these paths will be enabled, thus selecting a point that has been programmed to a logic 1 or 0. This is also true of the lower four pair of mosfets. The output circuitry 408 of the LUT implements a 2-to-1 multiplexer to select between the outputs of the two 4-to-1 multiplexers described above. The signals from the 4-to-1 multiplexers pass through inverters 410 and 412 to buffer and amplify the signals. Two weak p-channel mosfets 414 and 416 feed back around inverters 410 and 412 causing the inputs to inverters 410 and 412 to charge all the way to VDD when the data inputs are logic 1's. Otherwise, the data inputs would float at around VDD-Vth, thus potentially causing significant leakage through inverters 410 and 412. Two standard CMOS transition gates 418 and 420 are connected to the output of inverters 410 and 412 to select the output of either the upper 4-to-1 multiplexer, or the lower one, depending on the value of the C select line. The output signal of the LUT is driven out at a high strength by buffer 422. Finally, two transistors 424 and 426 are used for testing the LUT.

FIG. 5 illustrates a 2-input LUT (similar to LUT Z shown in FIG. 3) with a test circuit implemented in a 4-to-1 multiplexer as well as the method of using the test circuit. The logic inputs 502 drive the select lines of the multiplexer using the inverters 514 and 516 that enable only one selected path through the multiplexer at a time. The data inputs 504 have constant inputs that are programmably tied to one of the supply voltages through vias. The LUT has two columns of n-channel mosfets 506. Notice that there are 4 pairs of n-channel mosfets in series. The four pair of mosfets are enabled with the four possible combinations of A and not-A, and B and not-B. Depending on the state of the A and B select lines, one of these paths will be enabled, thus selecting a point that has been programmed to a logic 1 or 0. The signal from the 4-to-1 multiplexer passes through inverter 508 to buffer and amplify the signal. A weak p-channel mosfet 510 is feed back around inverter 508 to cause the input to inverter 508 to charge all the way to VDD when the data inputs are logic 1's. Otherwise, the data inputs would float at around VDD-Vth, thus potentially causing significant leakage through inverter 508. Finally, transistor 512 is used for testing the LUT.

Figure 6:
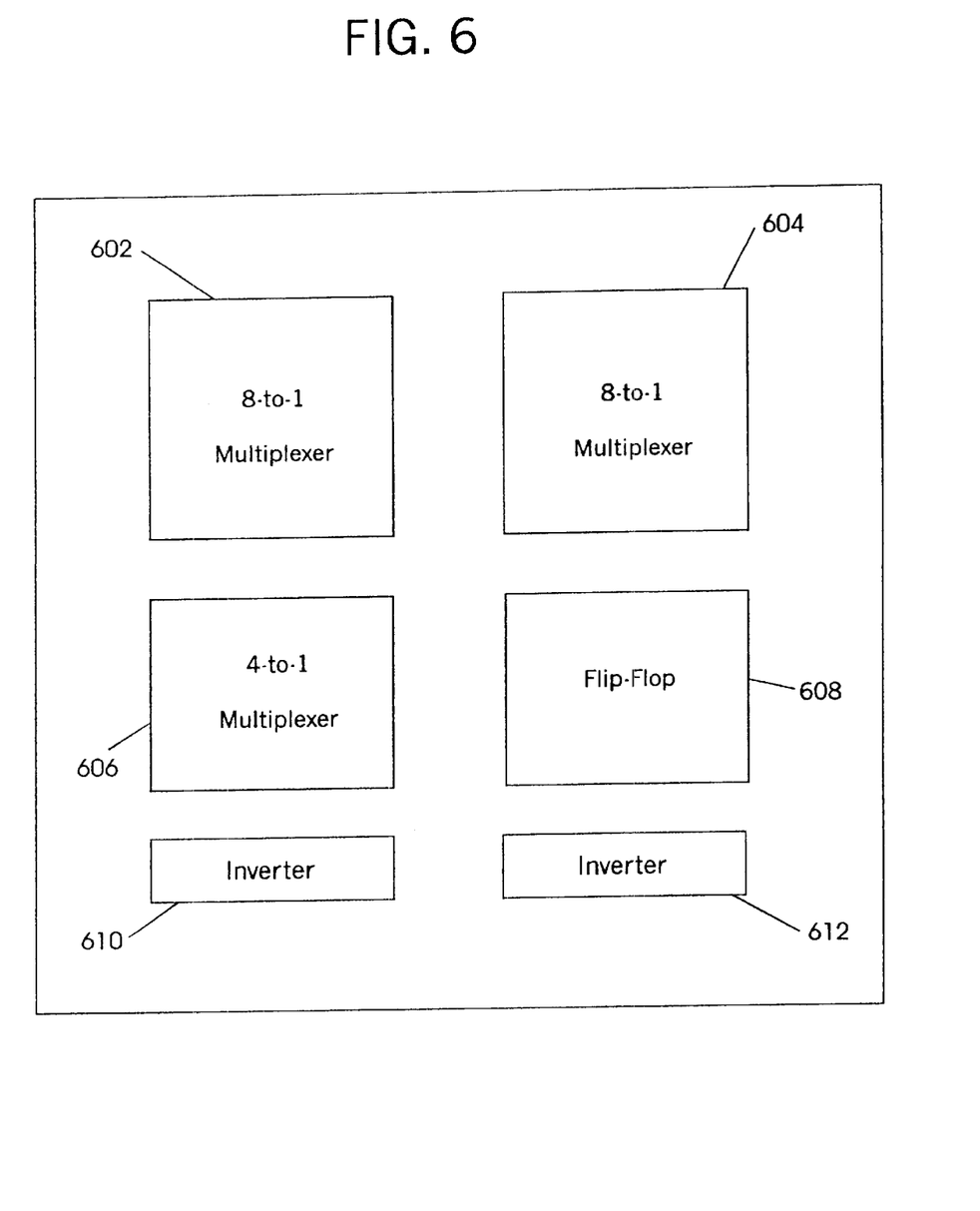
FIG. 6 illustrates an example layout of the logic elements of the cell shown in FIG. 3.

FIG. 6 illustrates an approximate, example layout of the logic elements in a cell on a chip like that discussed above with regard to FIG. 3. Programming vias are roughly located in a middle vertical strip in the logic cell; therefore, all of the LUT's need to be adjacent to these vias. The two 8-to-1 multiplexers 602 and 604 that implement the 3-input LUT's may be located in the upper half of the logic cell as shown with the data inputs aligned vertically just under the 32 programming vias located in the upper half of the cell. There are 8 more vias for the 4-to-1 multiplexer 606 that implements the 2-input LUT that may be placed on the left side of the logic cell. Flip-flop 608 is located on the right side of the cell because there is room available for it there. The two inverters 610 and 612 are used for extra drive strength and are shown at the bottom of the layout.

Figure 7:
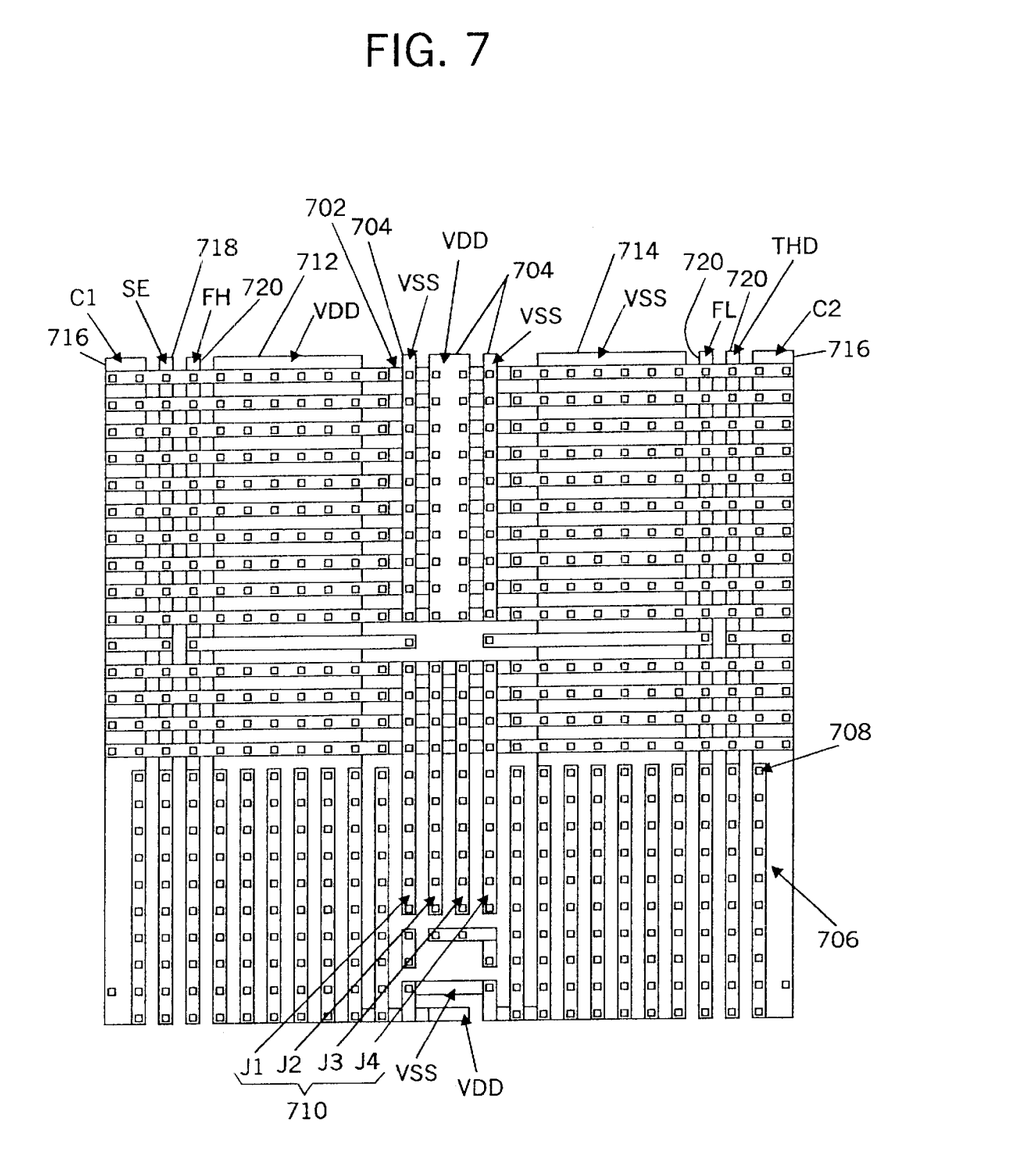
FIG. 7 illustrates the metal 4 and 5 layers of a typical ASIC using the present invention.

FIG. 7 illustrates the metal 4 (M4) and metal 5 (M5) layers of a typical ASIC using the invention with the M4 layer shown overlaying the M5 layer. The horizontal routing lines, 702, are illustrated in the upper half of FIG. 7 that jump to M5 in order to avoid the programming vias in the vertical lines, 704, located in middle section of the cell. The lower half of FIG. 7 illustrates M4 in the vertical direction, 706. There are vias, 708, to M3 in the upper end of the vertical M4 segments where the vertical lines, 706, continue to the next vertical segment above. In combination with the vias to M3, along the bottom of these vertical segments, we are able to break the vertical lines at the top, bottom, or middle of the cell. The jumpers J1, J2, J3 and J4, 710, (as shown in FIG. 3) can be seen in the lower portion of the vertical lines in the middle section of the cell. The VDD and VSS lines, 704, are located at the top of the cell for configuring the LUT's in the cell. In M5, notice the very wide vertical power strips 712 and 714 that should provide sufficient metal for excellent power distribution. C1 and C2, 716, are global clock lines in the vertical M5 metal that are used throughout the cell. Reset, test signal 1 and test signal 2 may also be routed in vertical M5 metal. The vertical line SE, 718, is scan-enable used in the flip-flop referred to in FIG. 3. In one embodiment of the invention, the vertical lines FH, FL and THD, 720, are free resources that may be used for routing signals in the cell, such as the test signals TR1 and TR2. The assignment of these resources depends on the exact layout used for the cell.

Figure 8:
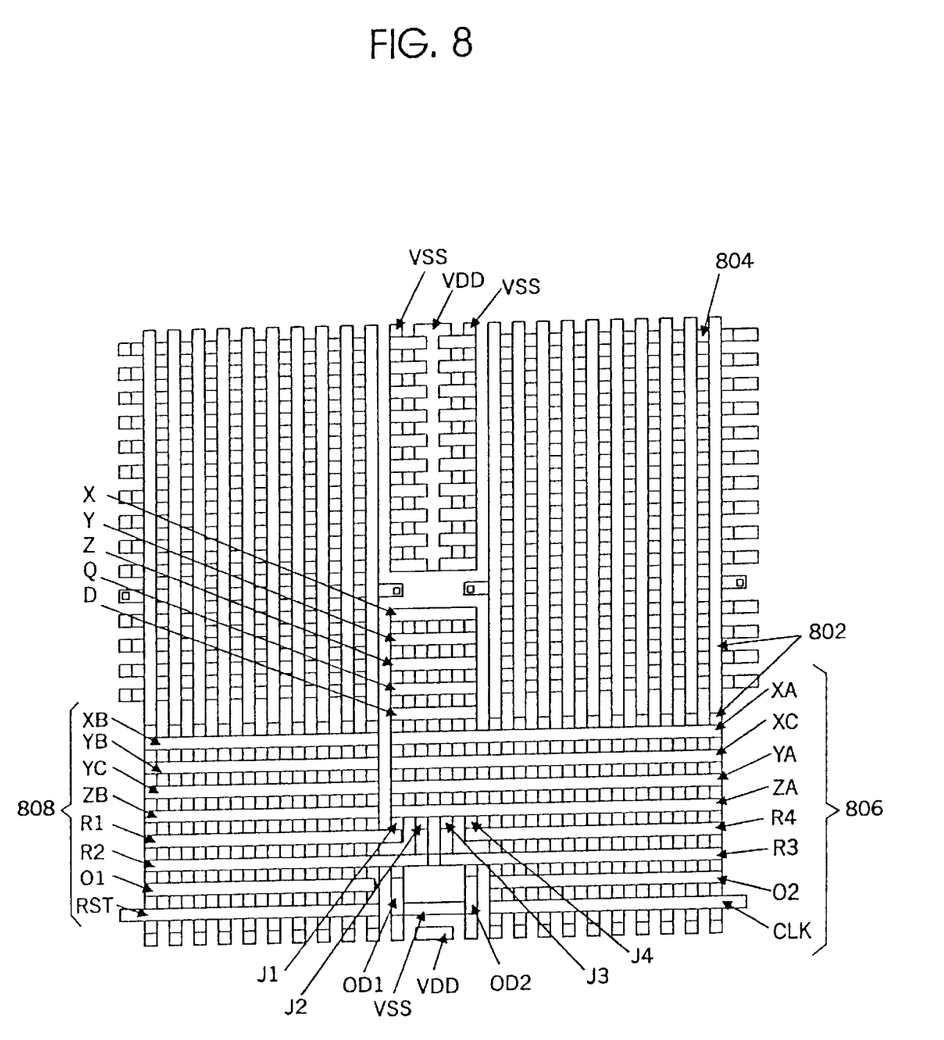
FIG. 8 illustrates the metal 3 and 4 layers of a typical ASIC using the present invention.

FIG. 8 illustrates the metal 3 (M3) and metal 4 (M4) layers with the M3 layer shown overlaying the M4 layer. In one embodiment, there are 20 vertical routing lines, 802, that span from the top of the cell to the bottom these lines provide for the vertical general purpose routing. The vertical routing lines 802 are in the M3 layer in the upper portion of the cell, and in the M4 layer in the lower portion of the cell. This allows horizontal I/O wires, 806 and 808, to cross them in the M3 layer in the lower portion of the cell. The labels shown in FIG. 8 are provided for convenience and correspond to the same labels shown in FIG. 3. There are 14 horizontal routing lines, 804, that span from the left to right of the cell, except as shown in FIG. 7 where the lines jump to the M5 layer in order to jump over the LUT programming and jumper vias shown in the middle strip of the cell.

Figure 9:
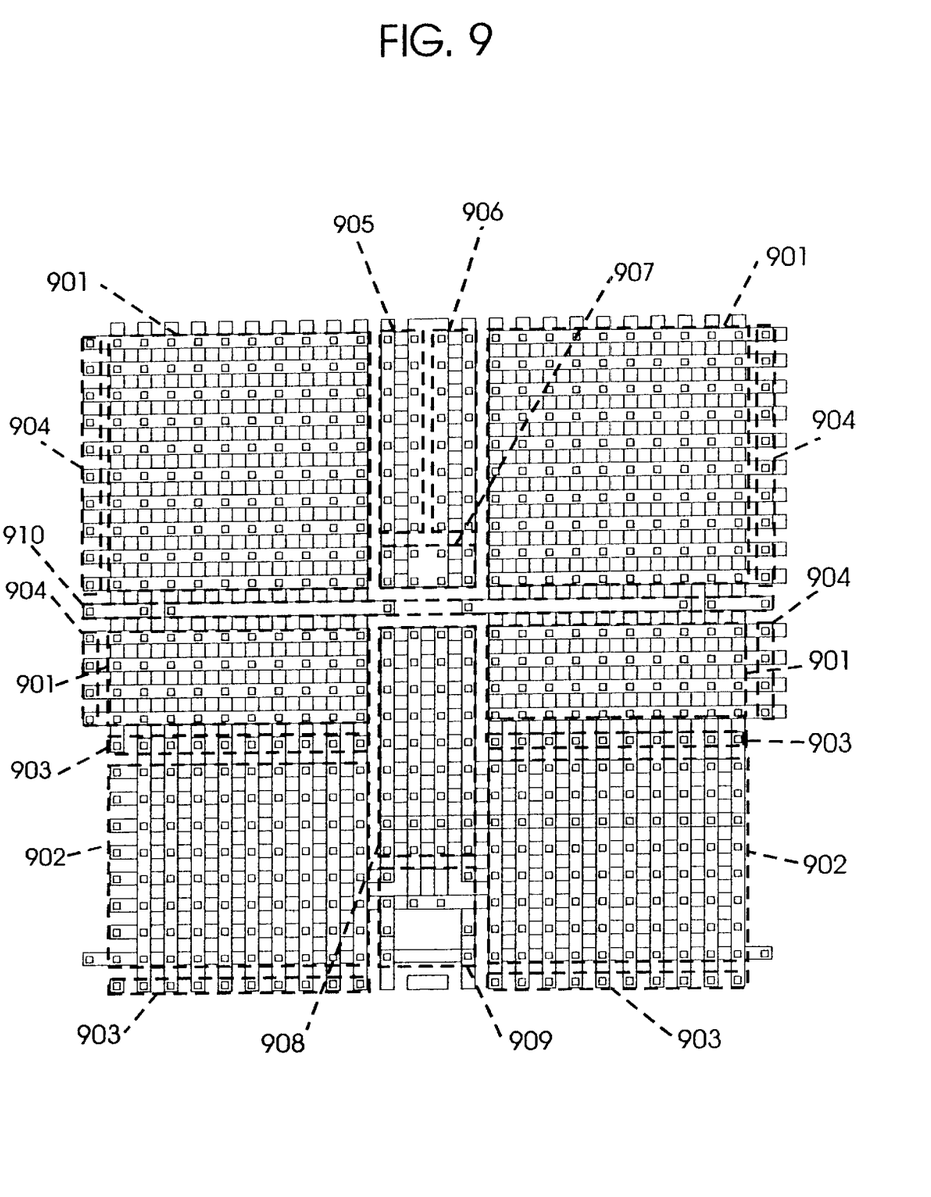
FIG. 9 illustrates the metal 3 and 4 layers of a typical ASIC with annotations to identify groups of programming vias according to at least some embodiments of the present invention.

FIG. 9 illustrates an embodiment of the metal 3 (M3) and metal 4 (M4) layers with the M4 layer shown overlaying the M3 layer and annotated with reference numbers to identify various groups of programming vias. Layout areas 901 allow the vertical routing lines on M3 to connect to the horizontal routing lines on M4. The left group of horizontal wires are shorted to the right group of horizontal wires through M5. The use of M5 jumps over the vias in groups 905–907. Layout areas 902 allow the LUT inputs, RST, CLK, and the outputs of the cell (R1–R4, O1, O2) to connect to the vertical routing lines. There are four via groups, 903, that allow signals to travel from the lower portion of the vertical routing lines located on M4 layer of the cell to upper portion of the vertical routing lines located on the M3 layer of the cell. These vias 903 allow the vertical routing lines to be broken either at the bottom of the cell, or in the middle, or to connect to make longer wires. Four more groups of vias, 904, allow horizontal routing lines to be broken at the left and right sides of the cell. There are 16 programming vias, 905, that are used to program one of the 3-input LUT's that is located below and to the left of these vias (see FIG. 6 for an example layout of the logic elements). There are 16 additional programming vias, 906, that are used to program the other 3-input LUT that is located below and to the right of these vias. There are eight programming vias, 907, that are used to program the 2-input LUT that is located somewhere below and possibly to the left of these vias. Vias 908 attach jumpers J1–J4 to internal signals within the logic cell, which allows local connections to be made without using the general routing wires outside of the cell. Vias 909 connect the jumpers J1–J4 to R1–R4, and allows O1D and O2D to connect to the jumpers and VSS. O1D and O2D allow outputs O1 and O2 to either be driven directly, or to have one high-drive buffer, or to have both high-drive buffers in parallel. The horizontal section of vias, 910, allows four vertical signals on M4 to connect down to the metal 1 (M1) layer. This allows up to four test signals to be used. Horizontal VSS and VDD wires need to be routed on the metal 2 (M2) layer to form a grid with the vertical power wires on M5.

FIGS. 7–9 illustrate a method of making a semiconductor device utilizing the cell architecture shown in FIG. 3 according to at least some embodiments of the present invention. Initially, a semiconductor layer is formed which has a mask-configurable gate array with logic cells as shown in FIG. 3. The logic cells in the semiconductor layer include at least two three-input lookup tables, at least one two-input look-up table and a flip-flop. The look-up tables in the logic cells are interconnected so that any one look-up table can drive at least one input of at least one other look-up table and the flip-flop is connected to the look-up tables so that any look-up table can drive an input of the flip-flop. As illustrated in FIGS. 7–9, a plurality of metal layers are formed on top of the semiconductor layer for routing connections where at least some of the metal layers are used to configure the gate array logic cells.

The designs using an embodiment of the invention disclosed herein may be routed without having all of the via locations available to the router. This is not of much use if the vias are small enough to fit into the space occupied by the intersection of vertical and horizontal minimum width metal traces. However, if the via connections for some reason are larger than the metal pitch, it may be of great value to depopulate them. A 50% depopulation of the vias is preferable using some laser via technology that will provide almost twice the density and ensures that the programmable vias do not dominate the programming layer. Otherwise, a larger geometry via layer deposited over a small geometry wafer may work well with a similar architecture. Depending on the difference between the base wafer geometry and the top via and metal layer geometry, a depopulation of 0%–75% works well. For example, if the difference between metal pitch on lower layers of metal, and the top metal layer is 4×, a 75% depopulation scheme works well.

The embodiments of the invention as described herein may include the use of random access memory (RAM) that may be distributed throughout the logic array, so that a single cell fabric can provide both logic and RAM functionality. Additional information on the use of distributed RAM in a logic array can be found in the U.S. Patent application filed by William D. Cox with the United States Patent and Trademark Office on May 17, 2002, Ser. No. 10/150,685, entitled "Distributed RAM in a Logic Array", which is incorporated herein by reference.

Specific embodiments of an invention are described herein. One of ordinary skill in the semiconductor arts will quickly recognize that the invention has other applications in other environments. In fact, many embodiments and implementations are possible. The following claims are in no way intended to limit the scope of the invention to the specific embodiments described above.

I claim:

1. A semiconductor device comprising:
   a plurality of logic cells interconnected using via connections between routing tracks that are disposed among a plurality of layers, wherein said logic cells comprise:
   at least two three-input look-up tables;
   at least one two-input look-up table;
   a flip-flop; and
   wherein the look-up tables are interconnected so that any one look-up table can drive at least one input of at least one other look-up table and the flip-flop is connected to the look-up tables so that any look-up table can drive an input of the flip-flop.

2. The semiconductor device according to claim 1 wherein the logic cells are programmable and the programming is determined using via connections between the routing tracks.

3. The semiconductor device according to claim 1 wherein at least one of said at least two three-input look-up tables comprises at least one multiplexer.

4. The semiconductor device according to claim 1 wherein said at least one two-input look-up table comprises at least one multiplexer.

5. The semiconductor device according to claim 1 wherein said logic cells further comprise at least one inverter to buffer and amplify an output signal of the logic cell.

6. The semiconductor device according to claim 1 wherein the logic cells are arranged in an array of programmable cells having a multiplicity of inputs and outputs.

7. The semiconductor device according to claim 1 wherein the device is an application specific integrated circuit.

8. The semiconductor device according to claim 2 wherein said logic cells are programmed for testing the logic functions of the cell during a testing process.

9. The semiconductor device according to claim 8 wherein the testing process comprises:
   selecting at least one component in said logic cells to test;
   sending test data to the at least one component; and
   reading the internal nodes of the at least one component using a read circuit in such a manner so as to require a significant charge to flip the state of a read line in the read circuit to indicate that the internal nodes of the at least one component are not floating.

10. The semiconductor device according to claim 1 wherein said plurality of layers includes at least three metal layers and a single custom via layer used to interconnect said components in said logic cells.

11. A method of making a semiconductor device, the method comprising:
   forming a semiconductor layer comprising a mask-configurable gate array having logic cells that include at least two three-input look-up tables, at least one two-input look-up table and a flip-flop, wherein the look-up tables are interconnected so that any one look-up table can drive at least one input of at least one other look-up table and the flip-flop is connected to the look-up tables so that any look-up table can drive an input of the flip-flop; and
   forming a plurality of metal layers disposed on top of the semiconductor layer for routing connections wherein at least some of the plurality of metal layers configures the gate array logic cells.

12. The method of claim 11 wherein the gate array logic cells are configured with only some of the plurality of metal layers.

13. The method of claim 11 wherein the gate array logic cells are substantially configured with only one of the plurality of metal layers.

14. The method of claim 13 wherein the one of the plurality of metal layers is a via layer.

* * * * *